(12) United States Patent
Kim

(10) Patent No.: US 10,912,204 B2
(45) Date of Patent: Feb. 2, 2021

(54) ELECTRONIC DEVICE AND RIGID-FLEXIBLE SUBSTRATE MODULE

(71) Applicant: Samsung Electro-Mechanics Co., Ltd., Suwon-si (KR)

(72) Inventor: Won Gi Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 131 days.

(21) Appl. No.: 16/180,104

(22) Filed: Nov. 5, 2018

(65) Prior Publication Data

US 2019/0306993 A1    Oct. 3, 2019

(30) Foreign Application Priority Data

Mar. 30, 2018  (KR) .................. 10-2018-0037622
Jun. 19, 2018  (KR) .................. 10-2018-0070127

(51) Int. Cl.
*H05K 1/09*       (2006.01)
*H05K 3/46*       (2006.01)
(Continued)

(52) U.S. Cl.
CPC .......... *H05K 3/4691* (2013.01); *B32B 9/007* (2013.01); *B32B 9/041* (2013.01); *B32B 15/20* (2013.01);
(Continued)

(58) Field of Classification Search
CPC .. H05K 3/4691; H05K 1/0206; H05K 1/0207; H05K 1/0219; H05K 1/0225;
(Continued)

(56) References Cited

U.S. PATENT DOCUMENTS 5,004,639 A  *  4/1991  Desai ................. B32B 7/02
                                          428/138
5,206,463 A  *  4/1993  DeMaso ............. H05K 3/4691
                                          174/254
(Continued)

FOREIGN PATENT DOCUMENTS

JP    2009-164568 A    7/2009
JP    2012-94604 A     5/2012
(Continued)

OTHER PUBLICATIONS

Korean Office Action dated Nov. 14, 2019 in counterpart Korean Patent Application No. 10-2018-0070127 (7 Pages in English, 6 Pages in Korean).

*Primary Examiner* — Pete T Lee
(74) *Attorney, Agent, or Firm* — NSIP Law

(57) ABSTRACT

An electronic device and rigid-flexible substrate module includes a rigid-flexible substrate having a first region and a second region more flexible than the first region and having a first laterally extended region extending in a first lateral direction further than the first region, an integrated circuit (IC) disposed in a position lower than a position of the first region of the rigid-flexible substrate, a signal line electrically connected to the IC and extending to a lateral end of the second region of the rigid-flexible substrate, and a first heat dissipation ground layer including a first portion that overlaps the first region when viewed in a vertical direction, and a second portion different from the portion that overlaps the first laterally extended region when viewed in a vertical direction.

8 Claims, 22 Drawing Sheets

(51) Int. Cl.

| | |
|---|---|
| *H05K 1/03* | (2006.01) |
| *H05K 1/02* | (2006.01) |
| *B32B 9/00* | (2006.01) |
| *B32B 9/04* | (2006.01) |
| *B32B 15/20* | (2006.01) |
| *H05K 7/20* | (2006.01) |
| *H05K 9/00* | (2006.01) |

(52) U.S. Cl.
CPC ......... *H05K 1/0206* (2013.01); *H05K 1/0207* (2013.01); *H05K 1/028* (2013.01); *H05K 1/0219* (2013.01); *H05K 1/0225* (2013.01); *H05K 1/0277* (2013.01); *H05K 1/0298* (2013.01); *H05K 1/0393* (2013.01); *H05K 1/09* (2013.01); *H05K 7/205* (2013.01); *H05K 9/0064* (2013.01); *H05K 2201/066* (2013.01)

(58) Field of Classification Search
CPC .... H05K 1/0277; H05K 1/028; H05K 1/0298; H05K 1/0393; H05K 1/09; H05K 7/205; H05K 9/0064; H05K 2201/066; B32B 9/007; B32B 9/041; B32B 15/20
See application file for complete search history.

(56) References Cited

U.S. PATENT DOCUMENTS

| | | | |
|---|---|---|---|
| 7,292,448 B2* | 11/2007 | Urushibara | H05K 1/147 |
| | | | 156/252 |
| 8,188,372 B2* | 5/2012 | Sato | H05K 3/4652 |
| | | | 174/254 |
| 8,232,476 B2* | 7/2012 | Nakamura | H05K 1/028 |
| | | | 174/254 |
| 2002/0066954 A1* | 6/2002 | Huang | H01L 23/4334 |
| | | | 257/707 |
| 2009/0147482 A1 | 6/2009 | Katsuro | |
| 2009/0180733 A1 | 7/2009 | Hwang et al. | |
| 2011/0075374 A1 | 3/2011 | Kang et al. | |
| 2017/0141744 A1 | 5/2017 | Kim et al. | |
| 2018/0063995 A1 | 3/2018 | Lin | |

FOREIGN PATENT DOCUMENTS

| | | |
|---|---|---|
| KR | 10-2009-0078124 A | 7/2009 |
| KR | 10-2011-0033632 A | 3/2011 |
| KR | 10-2015-0037306 A | 4/2015 |
| KR | 10-2017-0056391 A | 5/2017 |
| WO | WO 2014/168305 A1 | 10/2014 |

* cited by examiner

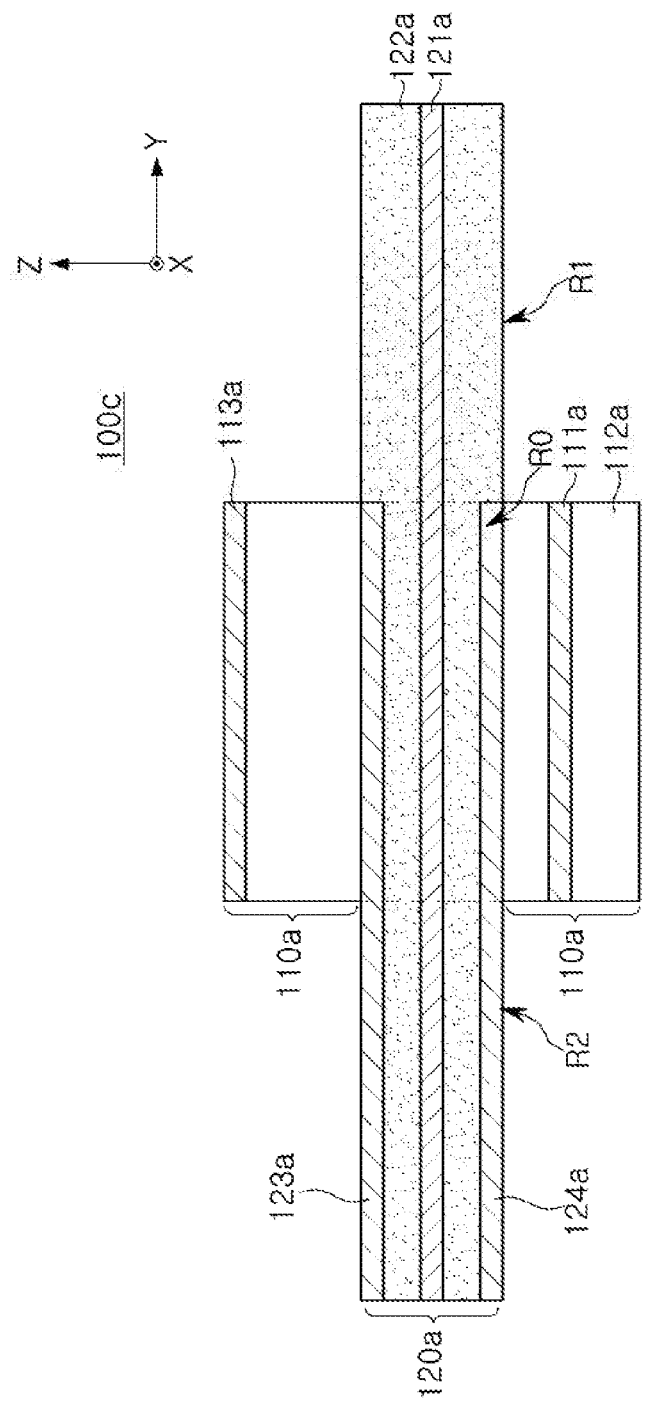

ELECTRONIC DEVICE AND RIGID-FLEXIBLE SUBSTRATE MODULE

CROSS-REFERENCE TO RELATED APPLICATIONS

This application claims the benefit under 35 USC 119(a) of Korean Patent Application No. 10-2018-0037622 filed on Mar. 30, 2018, and Korean Patent Application No. 10-2018-0070127 filed on Jun. 19, 2018, in the Korean Intellectual Property Office, the entire disclosures of which are incorporated herein by reference for all purposes.

BACKGROUND

1. Field

This application relates to an electronic device and rigid-flexible substrate module.

2. Description of the Background

In recently developed electronic devices, a flexible substrate, for example, a flexible printed circuit board (PCB), has been used to reduce the size of a product and efficiently utilize space, and in particular, a rigid-flexible substrate, for example, a rigid-flexible PCB, combining a rigid substrate and a flexible substrate, is increasingly being used.

In recent years, the development of various structures to dissipate heat generated in active devices in narrowed inner portions of electronic devices has been attempted.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a rigid-flexible substrate module includes a rigid-flexible substrate having a first region and a second region more flexible than the first region and including a first laterally extended region extending in a first lateral direction further than the first region, an integrated circuit (IC) disposed in a position lower than a position of the first region of the rigid-flexible substrate, a signal line electrically connected to the IC and extending to a lateral end of the second region of the rigid-flexible substrate, and a first heat dissipation ground layer having a first portion that overlaps the first region when viewed in a vertical direction, and a second portion different from the first portion that overlaps the first laterally extended region when viewed in a vertical direction.

The rigid-flexible substrate module may further include a second heat dissipation ground layer, wherein at least a portion of the second heat dissipation ground layer may be disposed in the second region of the rigid-flexible substrate, and wherein the signal line may be disposed between the first heat dissipation ground layer and the second heat dissipation ground layer.

The rigid-flexible substrate module may further include a third heat dissipation ground layer, wherein at least a portion of the third heat dissipation ground layer may be disposed between the first heat dissipation ground layer and the second heat dissipation ground layer in the second region of the rigid-flexible substrate, and spaced apart laterally from the signal line A plurality of heat dissipation vias may be disposed to electrically connect the first heat dissipation ground layer and the second heat dissipation ground layer, and may be arranged in parallel with the signal line.

A protection layer may be disposed in a position higher or lower than a position of the first laterally extended region of the second region of the rigid-flexible substrate, wherein at least a section of the second portion of the first heat dissipation ground layer may be exposed through the protection layer when viewed in a vertical direction.

The rigid-flexible substrate may further include a patch antenna disposed in the first region, wherein the IC may be electrically connected to the patch antenna, and wherein the IC may be configured to receive a base signal through the signal line and transmit a radio frequency (RF) signal having a frequency greater than a frequency of the base signal to the patch antenna.

A heat sink may be disposed in a position higher or lower than a position of the first laterally extended region of the second region of the rigid-flexible substrate, and the heat sink may be electrically connected to the first heat dissipation ground layer.

The second region of the rigid-flexible substrate may further include a second laterally extended region that extends further than the first region in a second lateral direction, wherein the heat sink may be disposed in a space defined by the second laterally extended region.

An exothermic electronic element may be disposed in a position higher or lower than a position of the second laterally extended region.

A width of the second laterally extended region may be greater than a width of the first laterally extended region.

An electronic device may include the rigid-flexible substrate module disposed in a cover, wherein the first laterally extended region may be connected to a signal connector disposed on a set substrate in the cover to electrically connect the IC to the set substrate.

The rigid-flexible substrate module may be electrically connected to at least one of a communications module and a baseband circuit disposed on the set substrate, the rigid-flexible substrate module may be disposed in a position higher than a position of the signal connector in the electronic device, and the first laterally extended region may be bent between the signal connector and the rigid-flexible substrate module to electrically connect the IC to the set substrate.

In another general aspect, a rigid-flexible substrate module includes a rigid-flexible substrate having a first region and a second region more flexible than the first region and including a first laterally extended region extending further than the first region in a first lateral direction and a second laterally extended region extending further than the first region in a second lateral direction, an integrated circuit (IC) disposed in a position lower than a position of the first region of the rigid-flexible substrate, a signal line electrically connected to the IC, and extending to a first lateral end of the second region of the rigid-flexible substrate, and a first heat dissipation ground layer having a first portion that overlaps the first region when viewed in a vertical direction, and a second portion different from the first portion that overlaps the second laterally extended region when viewed in a vertical direction.

The rigid-flexible substrate module may further include a heat sink disposed in a position higher or lower than a position of the second laterally extended region.

An exothermic electronic element may be disposed in a position higher or lower than a position of the second laterally extended region.

The rigid-flexible substrate module may further include a second heat dissipation ground layer having at least a portion disposed in the second laterally extended region, and at least one heat dissipation via disposed to electrically connect the first heat dissipation ground layer and the second heat dissipation ground layer in the second laterally extended region.

A protection layer may be disposed in a position higher or lower than a position of the second laterally extended region, wherein at least a portion of the first heat dissipation ground layer may be exposed through the protection layer when viewed in a vertical direction.

A patch antenna may be disposed in the first region, wherein the IC may be electrically connected to the patch antenna, and wherein the IC may receive a base signal through the signal line and transmit an RF signal having a frequency greater than a frequency of the base signal to the patch antenna.

An electronic device may include the rigid-flexible substrate module disposed in a cover, wherein the first laterally extended region may be connected to a signal connector disposed on a set substrate in the cover to electrically connect the IC to the set substrate, wherein the first laterally extended region may be connected to a signal connector disposed on a set substrate in the cover to electrically connect the IC to the set substrate, and wherein the rigid-flexible substrate module may be electrically connected to at least one of a communications module and a baseband circuit disposed on the set substrate.

Other features and aspects will be apparent from the following detailed description, the drawings, and the claims.

BRIEF DESCRIPTION OF DRAWINGS

FIG. 3B is a view illustrating first and second laterally extended regions of a rigid-flexible substrate module according to one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
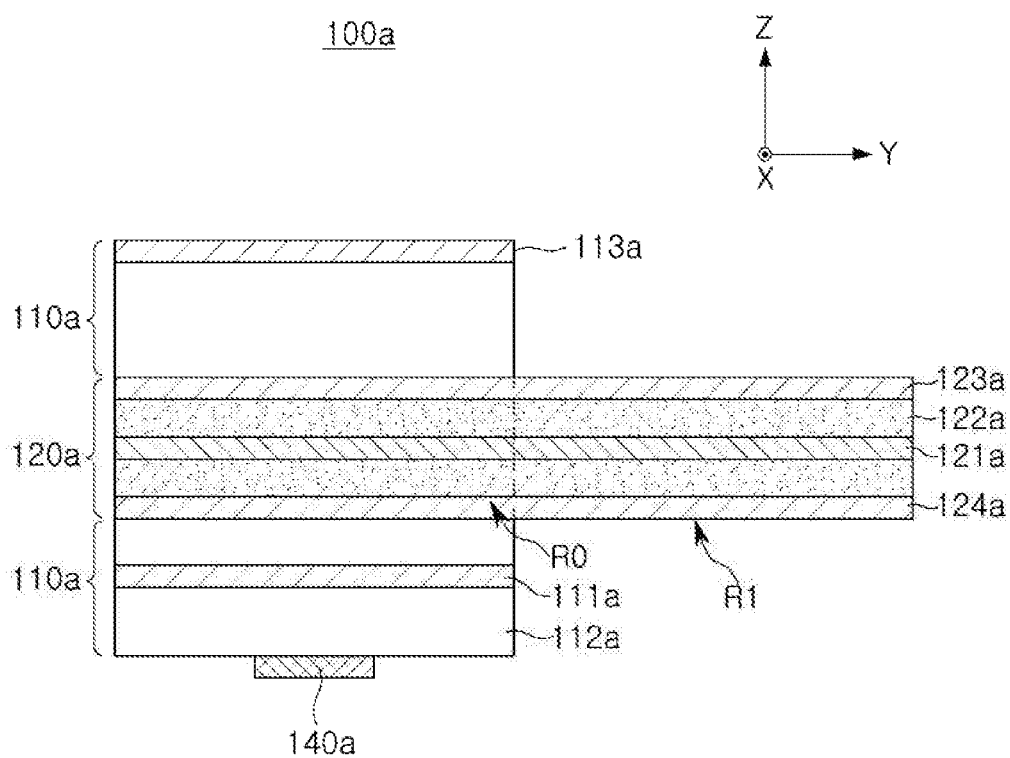
FIG. 1 is a view illustrating a rigid-flexible substrate module according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "higher," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," "upper," or "higher" relative to another element will then be "below" or "lower" relative to the other element. Thus, the term "above" encompasses both the above and below orientations depending on the spatial orientation of the device and the term "higher" encompasses both the higher and lower orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, refers to at least one example in which such a feature is included or implemented while all examples are not limited thereto.

An aspect of the present disclosure is to provide a rigid-flexible substrate module having an efficient heat dissipation structure.

FIG. 1 is a view illustrating a rigid-flexible substrate module according to one or more embodiments.

Referring to FIG. 1, a rigid-flexible substrate module 100a according to one or more embodiments may include a rigid-flexible substrate having a first region 110a and a second region 120a.

The first region 110a may include at least one conductive layer 111a and at least one first insulating layer 112a. For example, the first region 110a may have a structure similar to that of a printed circuit board (PCB). For example, the first insulating layer 112a may be implemented with glass-reinforced epoxy laminate material, for example FR4, a composite material composed of woven fiberglass cloth with an epoxy resin binder or low temperature co-fired ceramic (LTCC), but is not limited thereto, and may vary depending on standards of design for example, flexibility, dielectric constant, ease of bonding between a plurality of substrates, durability, cost, and the like.

The second region 120a may include a signal line 121a and a second insulating layer 122a, and may have an internal region R0 and a first laterally extended region R1.

The signal line 121a may provide a transmission path for at least a portion of a radio frequency (RF) signal, an intermediate frequency (IF) signal, and a baseband signal.

The second insulating layer 122a may have a greater elastic modulus than the first insulating layer 112a. Therefore, the second region 120a may be easily extended further than the first region 110a in a lateral direction. A portion of the second region 120a extending further than the first region 110a in the lateral direction may have a flexible characteristic to be easily connected to a signal connector. For example, the second insulating layer 122a may be implemented with a material having a large elastic modulus such as liquid crystal polymer (LCP) or polyimide, but is not limited thereto.

In this case, the signal line 121a may extend from the internal region R0 of the second region 120a to an end of the first laterally extended region R1, and may be electrically connected to the signal connector easily.

Referring to FIG. 1, the rigid-flexible substrate module 100a according one or more embodiments may further include an integrated circuit (IC) 140a disposed in a position lower than a position of the first region 110a of the rigid-flexible substrate.

The IC 140a may be electrically connected to the signal line 121a through a signal via disposed in the first region 110a. For example, the IC 140a may perform at least a portion of frequency conversion, amplification, filtering, phase control, and power generation.

During operation, a lot of heat may be generated in the IC 140a, and most of the heat generated in the IC 140a may be directed to the rigid-flexible substrate. When heat accumulated in the rigid-flexible substrate is not sufficiently dissipated, heat dissipation from the IC 140a externally of the IC 140a (including the rigid-flexible substrate) may be further reduced. When heat dissipation from the IC 140a externally of the IC 140a is not properly performed, a temperature of the IC 140a may become high, and a performance of the IC 140a may deteriorate.

Referring to FIG. 1, the rigid-flexible substrate module 100a according to one or more embodiments may include at least a portion of a second heat dissipation ground layer 123a and a first heat dissipation ground layer 124a.

The first heat dissipation ground layer 124a may have a first portion overlapping the first region 110a, when viewed in a vertical direction (z-axis direction in FIG. 1). Therefore, the first heat dissipation ground layer 124a may accommodate a large amount of heat of the rigid-flexible substrate.

In addition, the first heat dissipation ground layer 124a may have a second portion, different from the first portion, overlapping the first laterally extended region R1 of the second region 120a, when viewed in a vertical direction. Since the first laterally extended region R1 of the second region 120a has a relatively low height, the second portion overlapping the first laterally extended region R1 in the first heat dissipation ground layer 124a may be relatively closer externally.

Since the first heat dissipation ground layer 124a has a high thermal conductivity, the first heat dissipation ground layer 124a may dissipate heat received from the internal region R0 in the first laterally extended region R1. For example, the first heat dissipation ground layer 124a may serve as a heat pipe. Therefore, the rigid-flexible substrate may more efficiently dissipate accumulated heat externally, and the temperature of the IC 140a may be relatively lowered.

A first portion of the second heat dissipation ground layer 123a may overlap the first region 110a, when viewed in a vertical direction, and a second portion of the second heat dissipation ground layer 123a, different from the first portion, may overlap the first laterally extended region R1 of the second region 120a, when viewed in a vertical direction. Since the second heat dissipation ground layer 123a has a high thermal conductivity, the second heat dissipation ground layer 123a may dissipate heat received from the internal region R0 in the first laterally extended region R1.

Since the first heat dissipation ground layer 124a and the second heat dissipation ground layer 123a each have a shallow skin depth, the first heat dissipation ground layer 124a and the second heat dissipation ground layer 123a may act as an electromagnetic shield member to the signal line 121a. Therefore, electromagnetic noise received from the outside by the signal line 121a may be reduced.

Figure 2A:
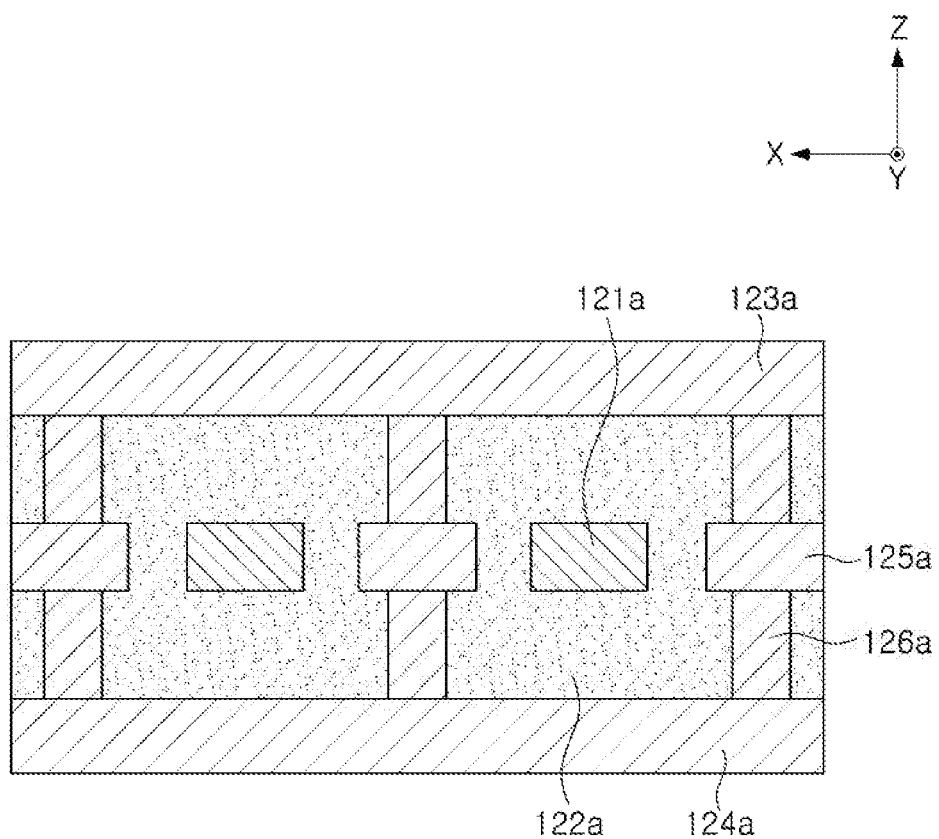
FIGS. 2A and 2B are views illustrating one or more embodiments of a laterally extended region of a second region of a rigid-flexible substrate.
Figure 2B:
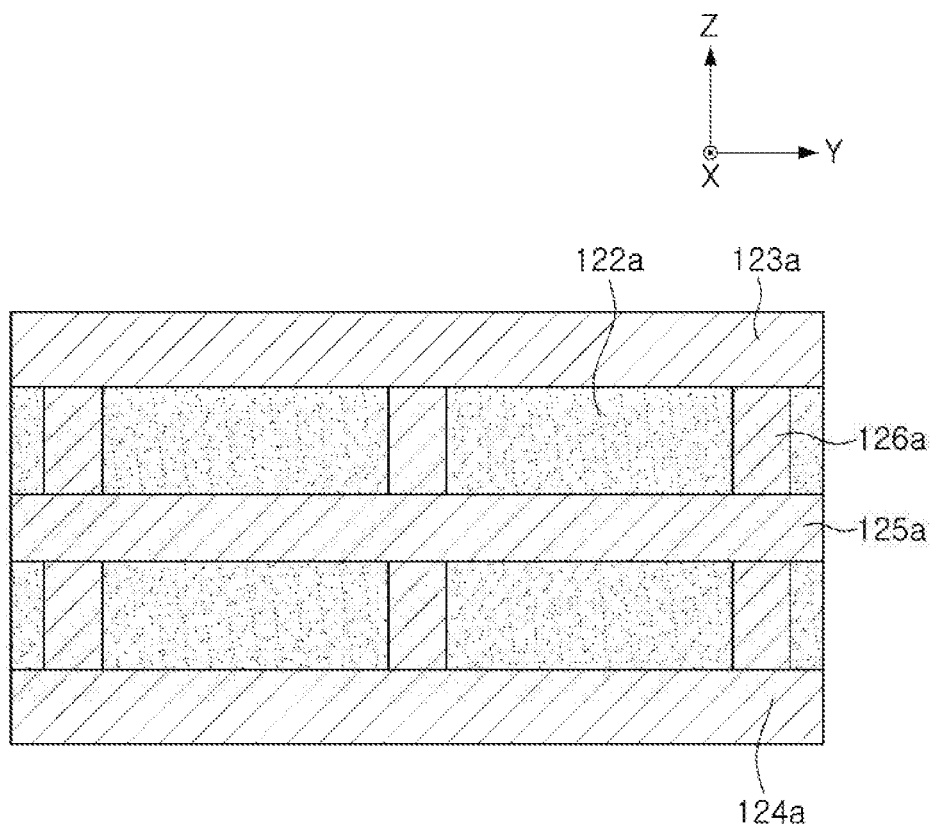

FIGS. 2A and 2B are views illustrating one or more embodiments of a laterally extended region of a second region of a rigid-flexible substrate.

Referring to FIGS. 2A and 2B, a rigid-flexible substrate module according to one or more embodiments may further include a third heat dissipation ground layer 125a and a heat dissipation via 126a.

The third heat dissipation ground layer 125a may be disposed between a second heat dissipation ground layer 123a and a first heat dissipation ground layer 124a, and may surround a side surface of a signal line 121a.

The third heat dissipation ground layer 125a may accommodate a portion of heat accommodated by the second heat dissipation ground layer 123a and the first heat dissipation ground layer 124a. Therefore, thermal capacities of the second heat dissipation ground layer 123a and the first heat dissipation ground layer 124a may be improved. In addition, the third heat dissipation ground layer 125a may balance heat of the second heat dissipation ground layer 123a and heat of the first heat dissipation ground layer 124a. Therefore, heat of the rigid-flexible substrate may be more effectively dissipated externally, and external electromagnetic noise may be more efficiently shielded.

The heat dissipation via 126a may be disposed to electrically connect the second heat dissipation ground layer 123a and the first heat dissipation ground layer 124a, and may be arranged along the signal line 121a. The heat dissipation via 126a may accommodate a portion of heat accommodated by the second heat dissipation ground layer 123a and the first heat dissipation ground layer 124a. Therefore, thermal capacities of the second heat dissipation ground layer 123a and the first heat dissipation ground layer 124a may be improved. In addition, the third heat dissipation ground layer 125a may balance heat of the second heat dissipation ground layer 123a and heat of the first heat dissipation ground layer 124a. Therefore, heat of the rigid-flexible substrate may be more effectively dissipated externally, and external electromagnetic noise may be shielded more efficiently.

Figure 2C:
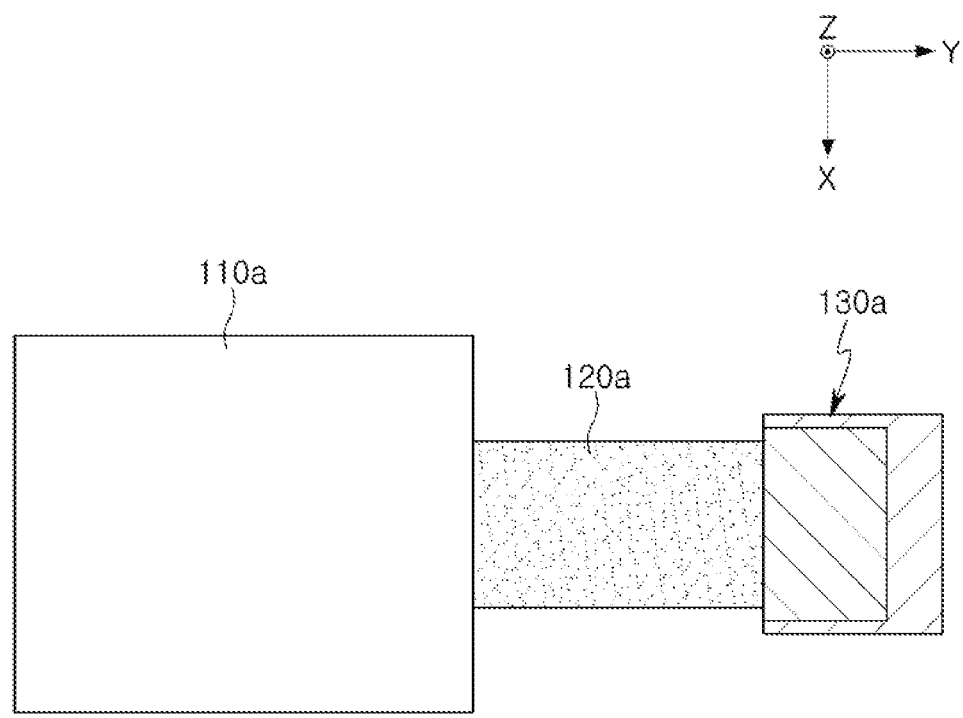
FIG. 2C is a view illustrating one or more embodiments of a connection of a signal connector of a laterally extended region of a second region of a rigid-flexible substrate.

FIG. 2C is a view illustrating one or more embodiments of a connection of a signal connector of a laterally extended region of a second region of a rigid-flexible substrate.

Referring to FIG. 2C, an end of a laterally extended region of a second region 120a of a rigid-flexible substrate may be electrically connected to a signal connector 130a. Therefore, an IC disposed on the rigid-flexible substrate may be electrically connected to the signal connector 130a, and may receive a signal from the signal connector 130a or transmit a signal to the signal connector 130a.

The laterally extended region of the second region 120a of the rigid-flexible substrate may serve both as a heat pipe and as a signal transmission path.

Figure 3A:
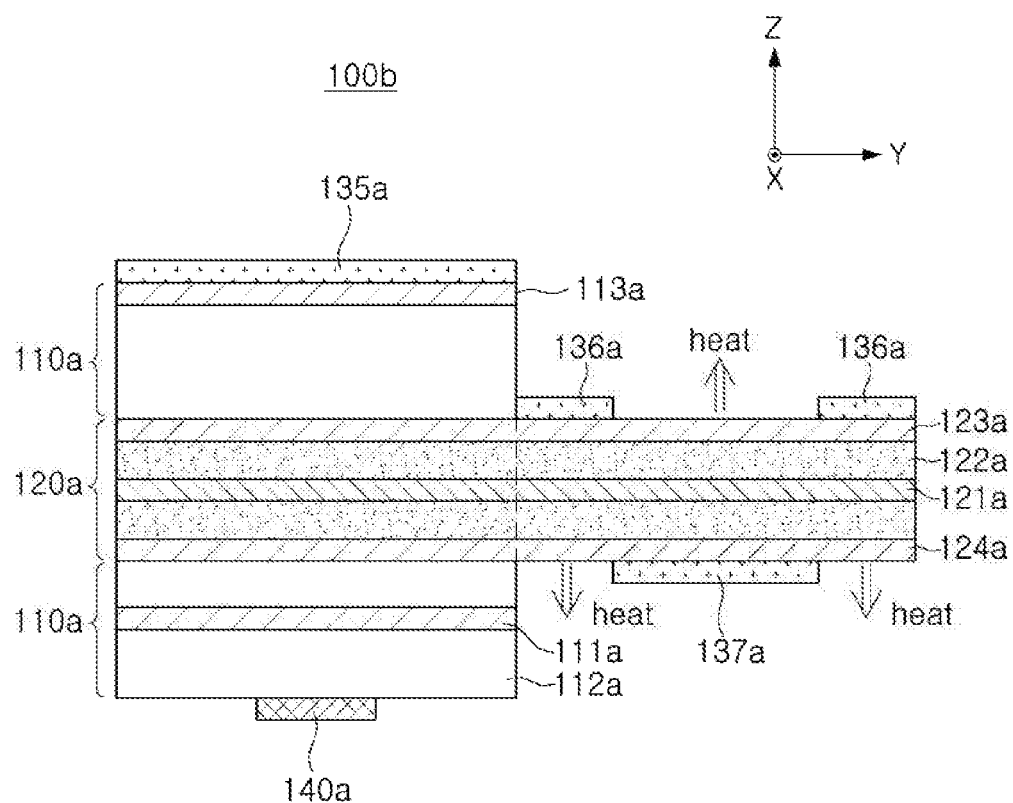
FIG. 3A is a view illustrating a protection layer of a rigid-flexible substrate module according one or more embodiments.

FIG. 3A is a view illustrating a protection layer of a rigid-flexible substrate module according to one or more embodiments of.

Referring to FIG. 3A, a rigid-flexible substrate module 100b according to one or more embodiments may further include at least a portion of a first protection layer 135a, a second protection layer 136a, and a third protection layer 137a.

The first protection layer 135a may cover a position higher than a position of a first region 110a of a rigid-flexible substrate. Therefore, an antenna layer 113a of the first region 110a may be protected from an external environment.

The second protection layer 136a may cover a position higher than a position of a first laterally extended region of a second region 120a of the rigid-flexible substrate. Therefore, a second heat dissipation ground layer 123a may be protected from an external environment.

For example, the second protection layer 136a may not cover a portion of the second heat dissipation ground layer 123a such that the portion of the second heat dissipation ground layer 123a may be exposed externally. Therefore, heat accommodated by the second heat dissipation ground layer 123a may be more easily dissipated into the portion not covered by the second protection layer 136a.

The third protection layer 137a may cover a position lower than a position of the first laterally extended region of the second region 120a of the rigid-flexible substrate. Therefore, the first heat dissipation ground layer 124a may be protected from an external environment.

For example, the third protection layer 137a may not cover a portion of the first heat dissipation ground layer 124a such that the portion of the first heat dissipation ground layer 124a may be exposed externally. Therefore, heat accommodated by the first heat dissipation ground layer 124a may be more easily dissipated into the portion not covered by the third protection layer 137a.

The first, second, and third protection layers 135a, 136a, and 137a may be implemented with a photoimageable encapsulant (PIE), Ajinomoto build-up film (ABF), epoxy molding compound (EMC), or the like, but is not limited thereto.

FIG. 3B is a view illustrating first and second laterally extended regions of a rigid-flexible substrate module according to one or more embodiments.

Referring to FIG. 3B, a second region 120a of a rigid-flexible substrate of a rigid-flexible substrate module 100c according to one or more embodiments may have a first laterally extended region R1 and a second laterally extended region R2.

In this case, the first laterally extended region R1 may be used as a signal transmission path, and the second laterally extended region R2 may be used as a heat pipe.

Therefore, the first laterally extended region R1 and the second laterally extended region R2 may be optimized for the signal transmission path and the heat pipe, respectively, and thermal noise of the first heat dissipation ground layer 124a and the second heat dissipation ground layer may isolate a signal line 121a of the first laterally extended region R1.

Figure 4A:
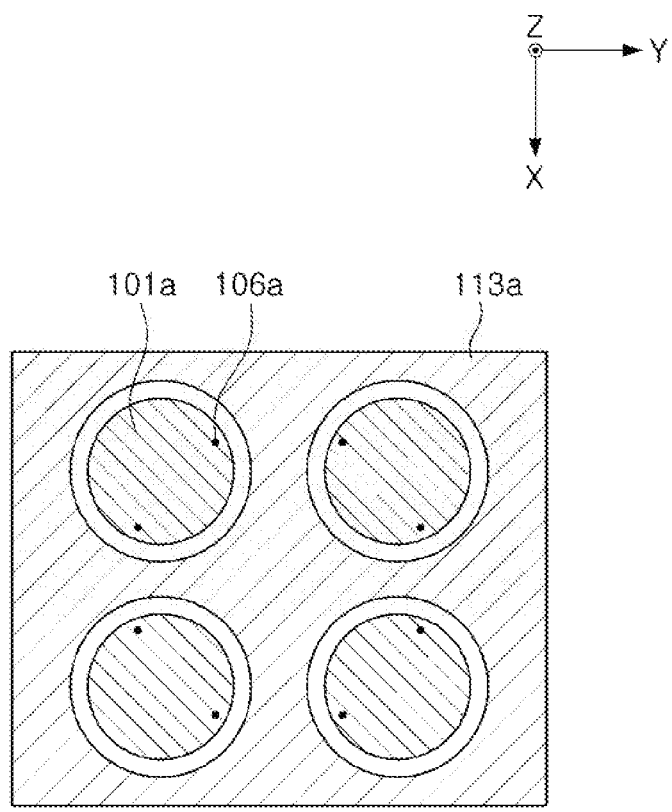
FIG. 4A is a view illustrating a patch antenna of a rigid-flexible substrate module according to one or more embodiments.

FIG. 4A is a view illustrating a patch antenna of a rigid-flexible substrate module according to one or more embodiments.

Referring to FIG. 4A, a rigid-flexible substrate module according to one or more embodiments may include a patch antenna 101a and an antenna layer 113a. The patch antenna 101a may be electrically connected to a first feed via 106a.

The patch antenna 101a may receive an RF signal from the first feed via 106a and transmit the RF signal in a vertical direction (a Z direction). The patch antenna 101a may receive an RF signal in a vertical direction (a Z direction) and transmit the RF signal to the first feed via 106a. The RF signal transmission/reception ratio of the patch antenna 101a may be proportional to the number of the patch antenna 101a.

Meanwhile, the first feed via 106a may have a structure of a through via or may have a structure in which a plurality of vias are connected in series.

Figure 4B:
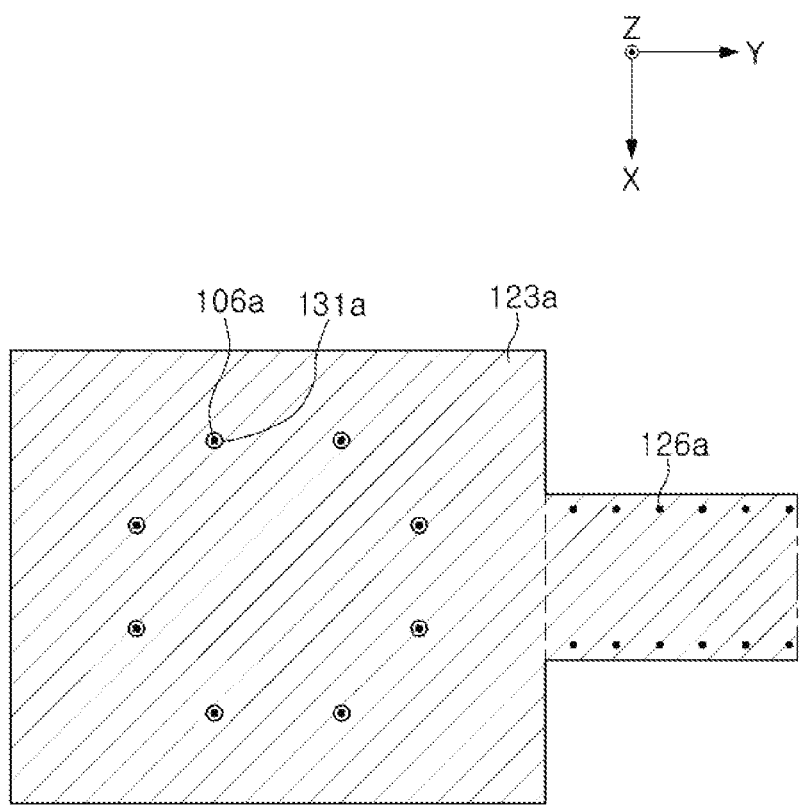
FIG. 4B is a view illustrating a second heat dissipation ground layer of a rigid-flexible substrate module according to one or more embodiments.

FIG. 4B is a view illustrating a second heat dissipation ground layer of a rigid-flexible substrate module according to one or more embodiments.

Referring to FIG. 4B, a second heat dissipation ground layer 123a may have a through-hole 131a through which a first feed via 106a passes, and may be electrically connected to a heat dissipation via 126a.

Figure 4C:
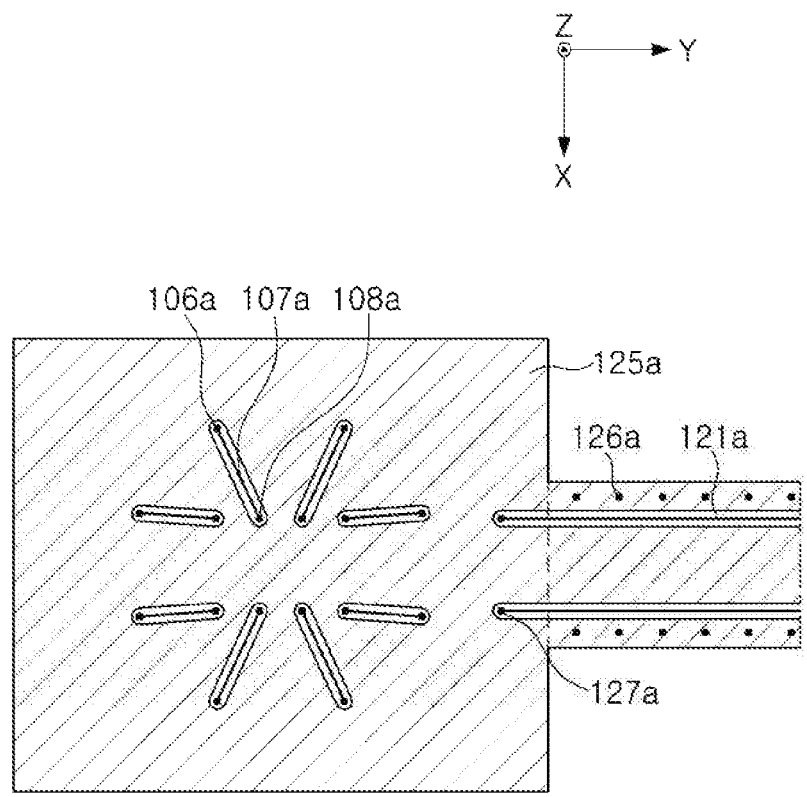
FIG. 4C is a view illustrating a third heat dissipation ground layer of a rigid-flexible substrate module according to one or more embodiments.

FIG. 4C is a view illustrating a third heat dissipation ground layer of a rigid-flexible substrate module according to one or more embodiments.

Referring to FIG. 4C, a third heat dissipation ground layer 125a may surround a signal line 121a and a feed line 107a, respectively, and may be electrically connected to a heat dissipation via 126a.

The signal line 121a may be electrically connected to a first signal via 127a.

An end of the feed line 107a may be electrically connected to the first feed via 106a, and another end of the feed line 107a may be electrically connected to a second feed via 108a.

Figure 4D:
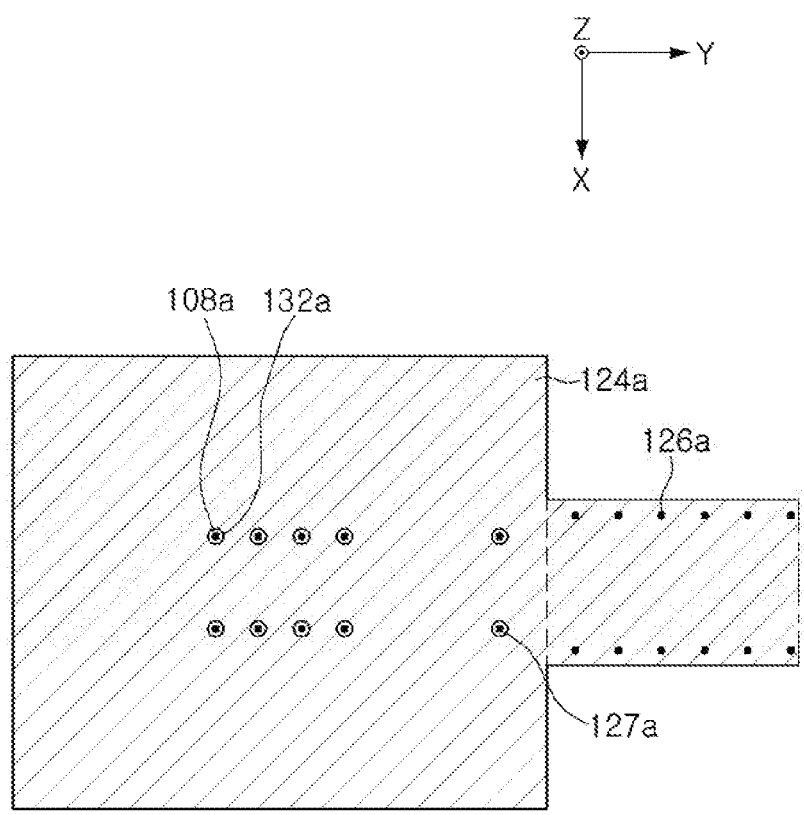
FIG. 4D is a view illustrating a first heat dissipation ground layer of a rigid-flexible substrate module according to one or more embodiments.

FIG. 4D is a view illustrating a first heat dissipation ground layer of a rigid-flexible substrate module according to one or more embodiments.

Referring to FIG. 4D, a first heat dissipation ground layer 124a may have a plurality of through-holes 132a through which a second feed via 108a and a first signal via 127a pass, respectively, and may be electrically connected to a heat dissipation via 126a.

Figure 4E:
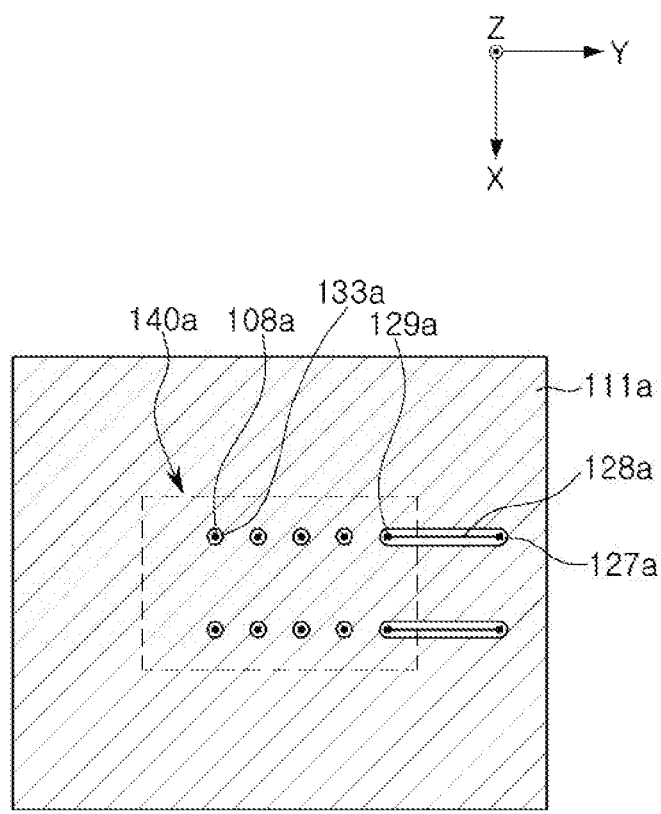
FIG. 4E is a view illustrating a conductive layer of a rigid-flexible substrate module according to one or more embodiments.

FIG. 4E is a view illustrating a conductive layer of a rigid-flexible substrate module according to one or more embodiments.

Referring to FIG. 4E, a conductive layer 111a may surround a second signal line 128a, and may have a through-hole 133a through which a second feed via 108a passes.

An end of the second signal line 128a may be electrically connected to a first signal via 127a, and another end of the second signal line 128a may be electrically connected to a second signal via 129a.

The second feed via 108a and the second signal via 129a may be electrically connected to an IC 140a disposed in a position lower than a position of the conductive layer 111a.

Figure 5A:
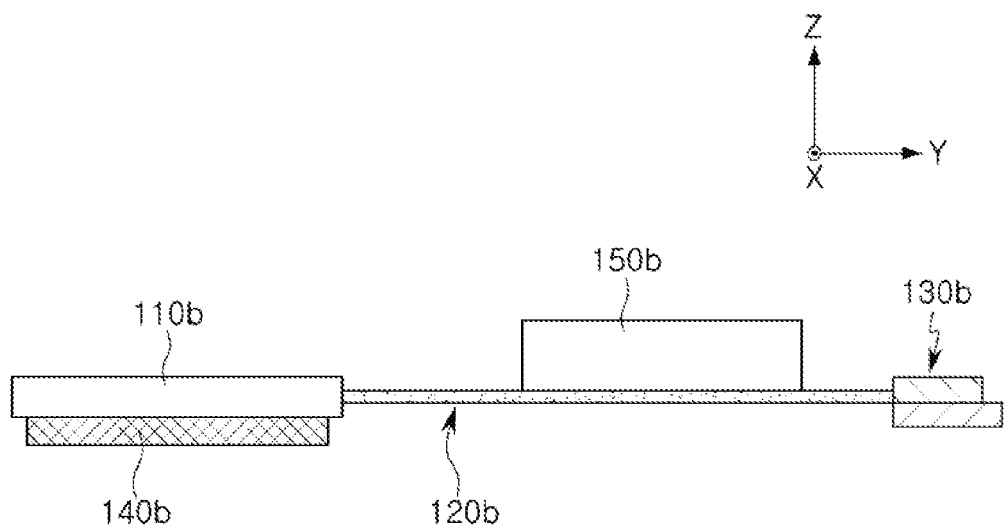
FIGS. 5A and 5B are views illustrating a structure in which a rigid-flexible substrate module according to one or more embodiments includes a heat dissipation member.
Figure 5B:
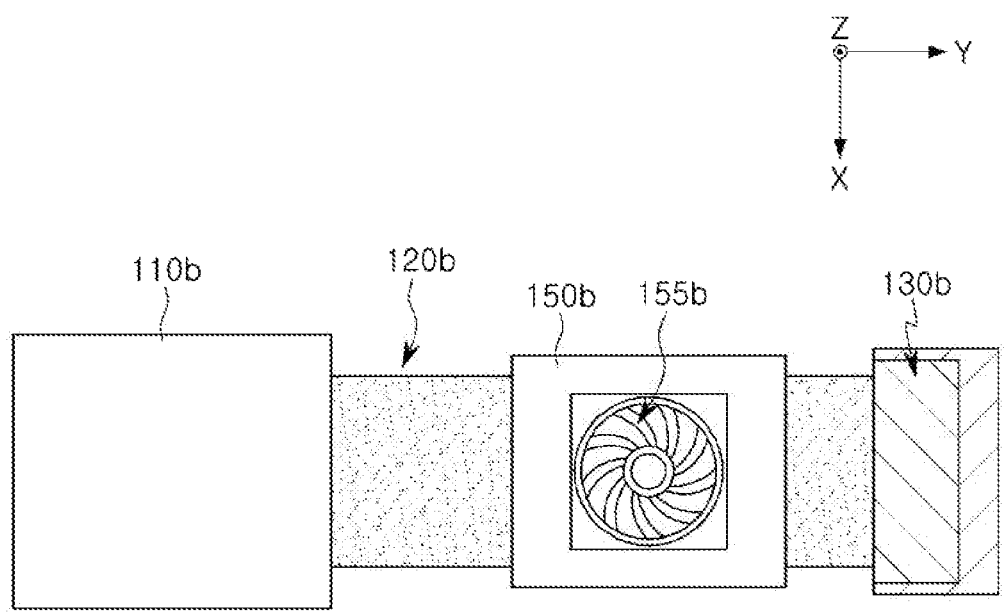

FIGS. 5A and 5B are views illustrating a structure in which a rigid-flexible substrate module according to one or more embodiments of the present disclosure includes a heat dissipation member.

Referring to FIGS. 5A and 5B, a rigid-flexible substrate module according to one or more embodiments may include a first region 110b, a second region 120b, a signal connector 130b, an IC 140b, and a heat dissipation member 150b.

The signal connector 130b may be electrically connected to a set substrate (not illustrated). Therefore, the IC 140b may transmit a signal to the set substrate or receive a signal from the set substrate.

The heat dissipation member 150b may be disposed in a position higher and/or lower than a position of a first laterally extended region of the second region 120b. For example, the heat dissipation member 150b may drive a heat dissipation fan 155b to diffuse heat in an air-cooling manner.

Figure 5C:
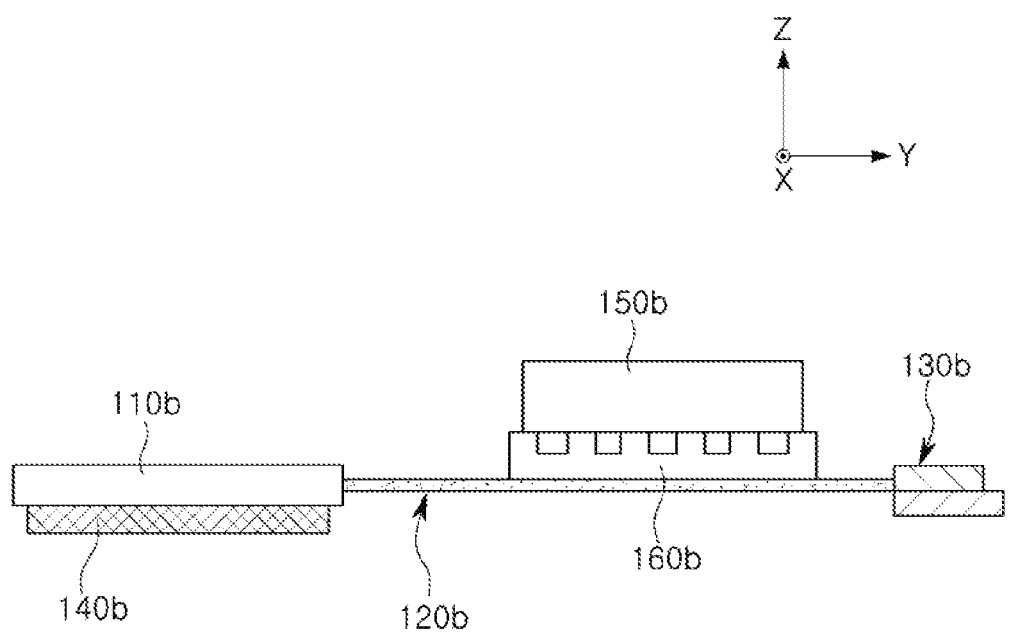
FIG. 5C is a view illustrating a structure in which a rigid-flexible substrate module according to one or more embodiments includes a heat sink.

FIG. 5C is a view illustrating a structure in which a rigid-flexible substrate module according to one or more embodiments includes a heat sink.

Referring to FIG. 5C, a rigid-flexible substrate module according to one or more embodiments may further include a heat sink 160b.

The heat sink 160b may be disposed between a first laterally extended region of a second region 120b and a heat dissipation member 150b, and may intensively receive heat of a first heat dissipation ground layer and/or heat of a second heat dissipation ground layer. Heat concentrated in the heat sink 160b may be efficiently diffused through the heat dissipation member 150b.

For example, the heat sink 160b may be mounted on the first laterally extended region of the second region 120b by an electrical connection structure, such as a solder ball, and may have a concave/convex boundary facing the heat dissipation member 150b. Therefore, heat of a signal line may be more efficiently dissipated.

Figure 6A:
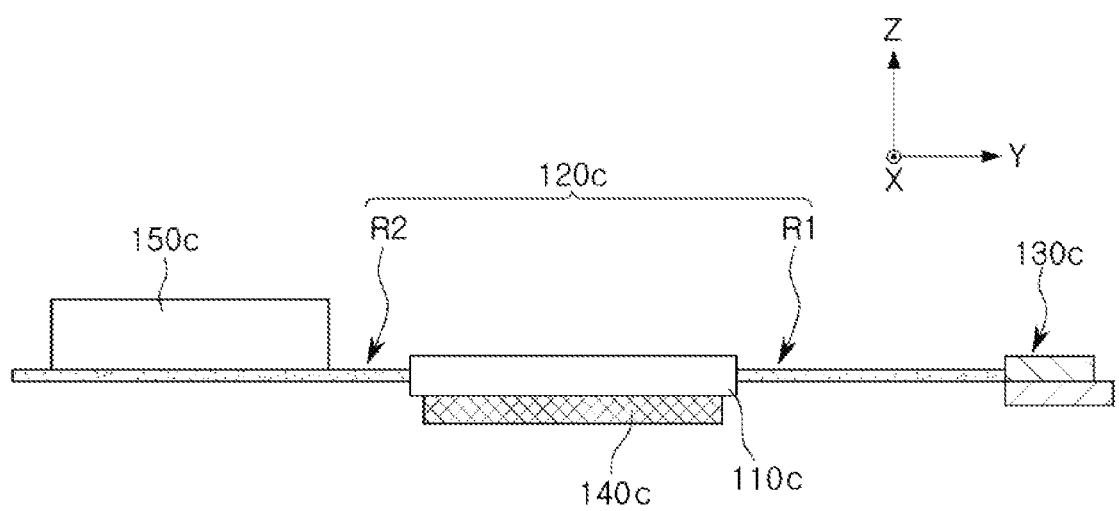
FIGS. 6A, 6B, and 6C are views illustrating first and second laterally extended regions of a rigid-flexible substrate module according to one or more embodiments.
Figure 6B:
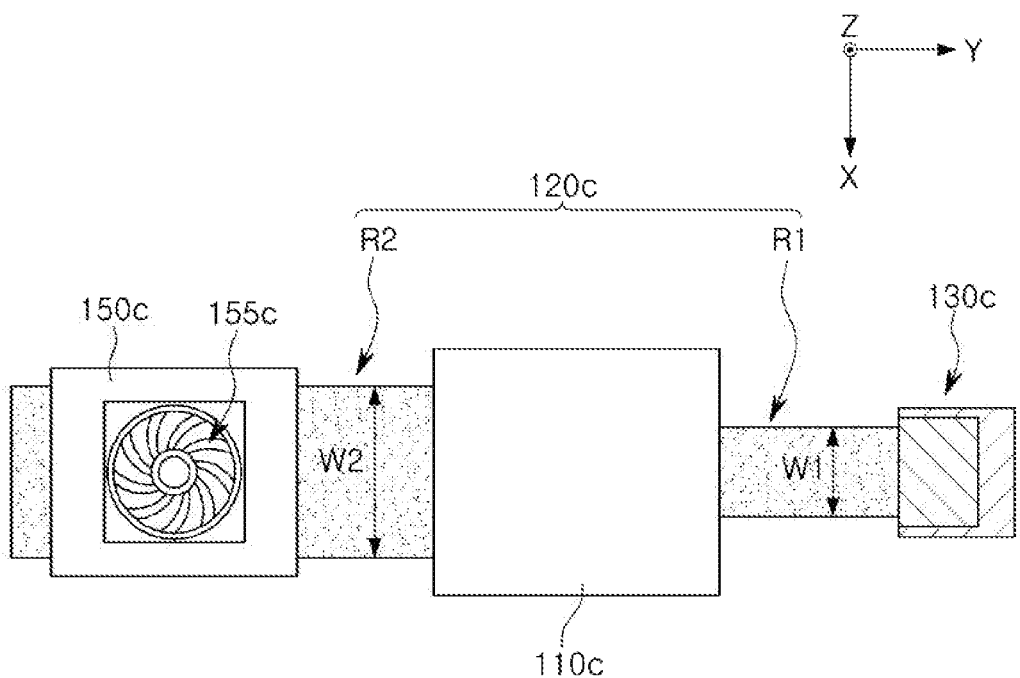
Figure 6C:
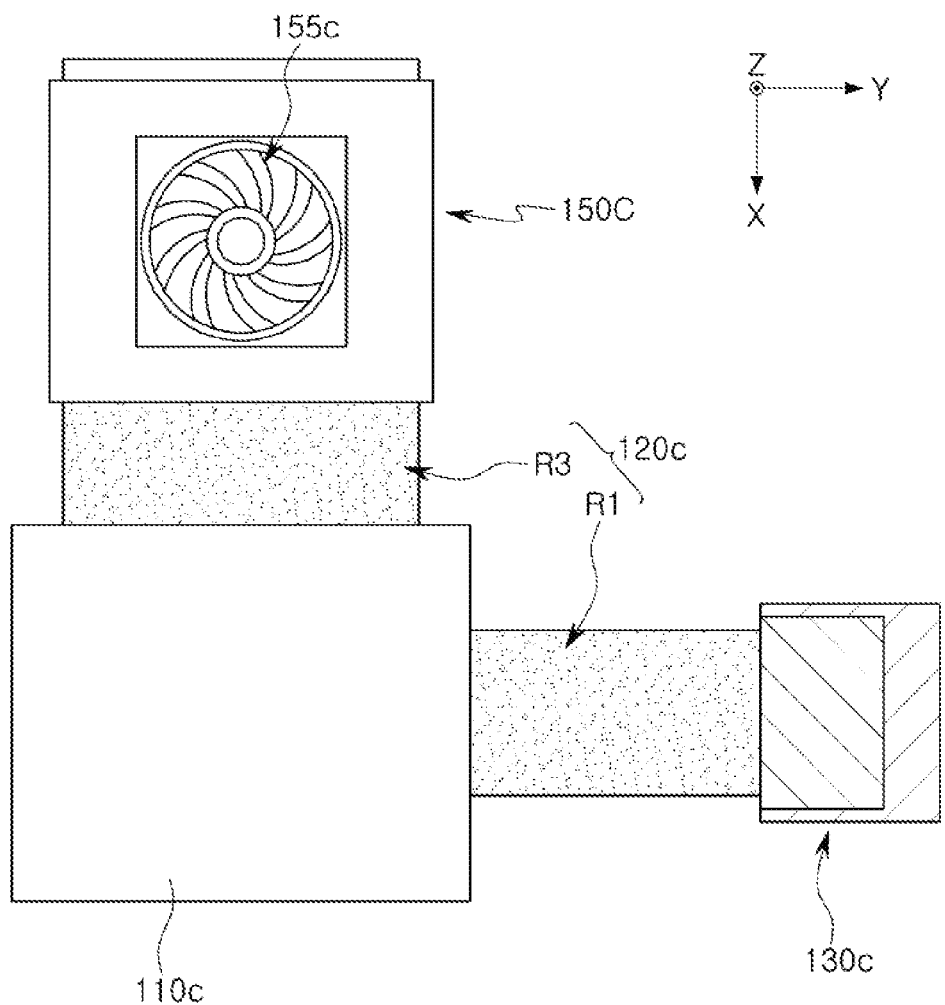

FIGS. 6A to 6C are views illustrating first and second laterally extended regions of a rigid-flexible substrate module according to one or more embodiments.

Referring to FIGS. 6A to 6C, a rigid-flexible substrate module according to one or more embodiments may include a first region 110c, a second region 120c, a signal connector 130c, an IC 140c, and a heat dissipation member 150c. The second region 120c may have a first laterally extended region R1 and a second laterally extended region R2.

The heat dissipation member 150c may be disposed in a position higher and/or lower than a position of the second laterally extended region R2. The first laterally extended region R1 may be designed to be suitable for signal transfer (e.g., a relatively tight ground arrangement), and the second laterally extended region R2 may be designed to be suitable for heat dissipation (e.g., a relatively large area). For example, a width W2 of the second laterally extended region R2 may be greater than a width W1 of the first laterally extended region R1.

Therefore, a rigid-flexible substrate module according to one or more embodiments may secure a relatively high heat dissipation performance while efficiently transmitting or receiving a signal externally.

Meanwhile, according to a design, the second region 120c may have a third laterally extended region R3. Although not illustrated in the drawing, the second region 120c may further include a fourth laterally extended region.

Figure 7A:
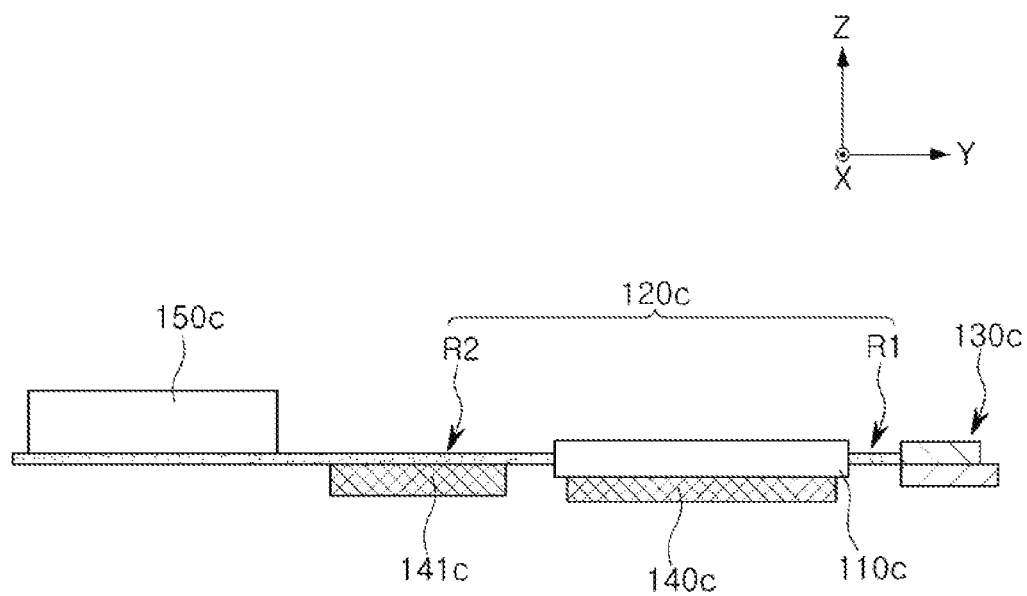
FIGS. 7A and 7B are views illustrating an exothermic electronic element disposed in a second laterally extended region of a rigid-flexible substrate module according to one or more embodiments.
Figure 7B:
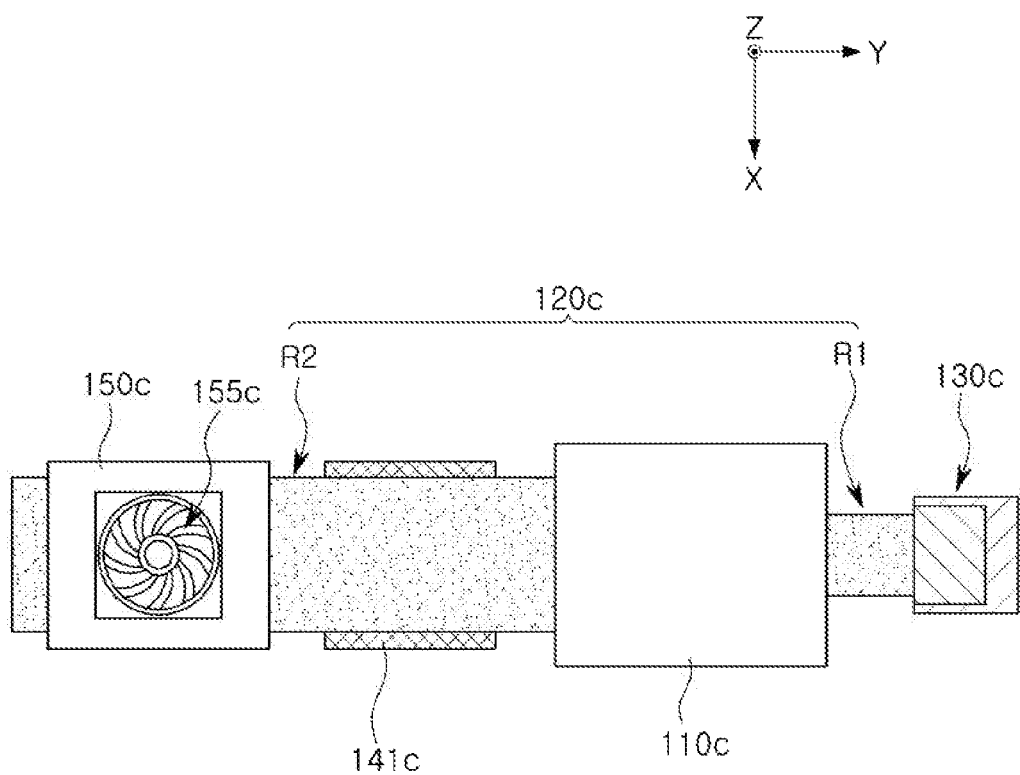

FIGS. 7A and 7B are views illustrating an exothermic electronic element disposed in a second laterally extended region of a rigid-flexible substrate module according to one or more embodiments.

Referring to FIGS. 7A and 7B, a rigid-flexible substrate module according to one or more embodiments may further include an exothermic electronic element 141c disposed in a second laterally extended region R2.

The exothermic electronic element 141c may be disposed in a position higher and/or lower than a position of the second laterally extended region R2. For example, the exothermic electronic component 141c may be mounted on the second laterally extended region R2 through an electrical connection structure (e.g., a solder ball, a bump), and may include at least one of an IC, a capacitor, for example, a multilayer ceramic capacitor (MLCC), an inductor, and a chip resistor.

Heat generated in the exothermic electronic element 141c may be transferred to a heat dissipation member 150c through the second laterally extended region R2. Therefore, a rigid-flexible substrate module according to one or more embodiments may dissipate externally heat generated from an IC 140c and heat generated by the exothermic electronic element 141c.

Since the second laterally extended region R2 may provide a space for arranging the exothermic electronic element 141c, even when a size of the exothermic electronic element 141c is relatively large, a space for arranging the exothermic electronic element 141c may be stably provided.

Figure 8:
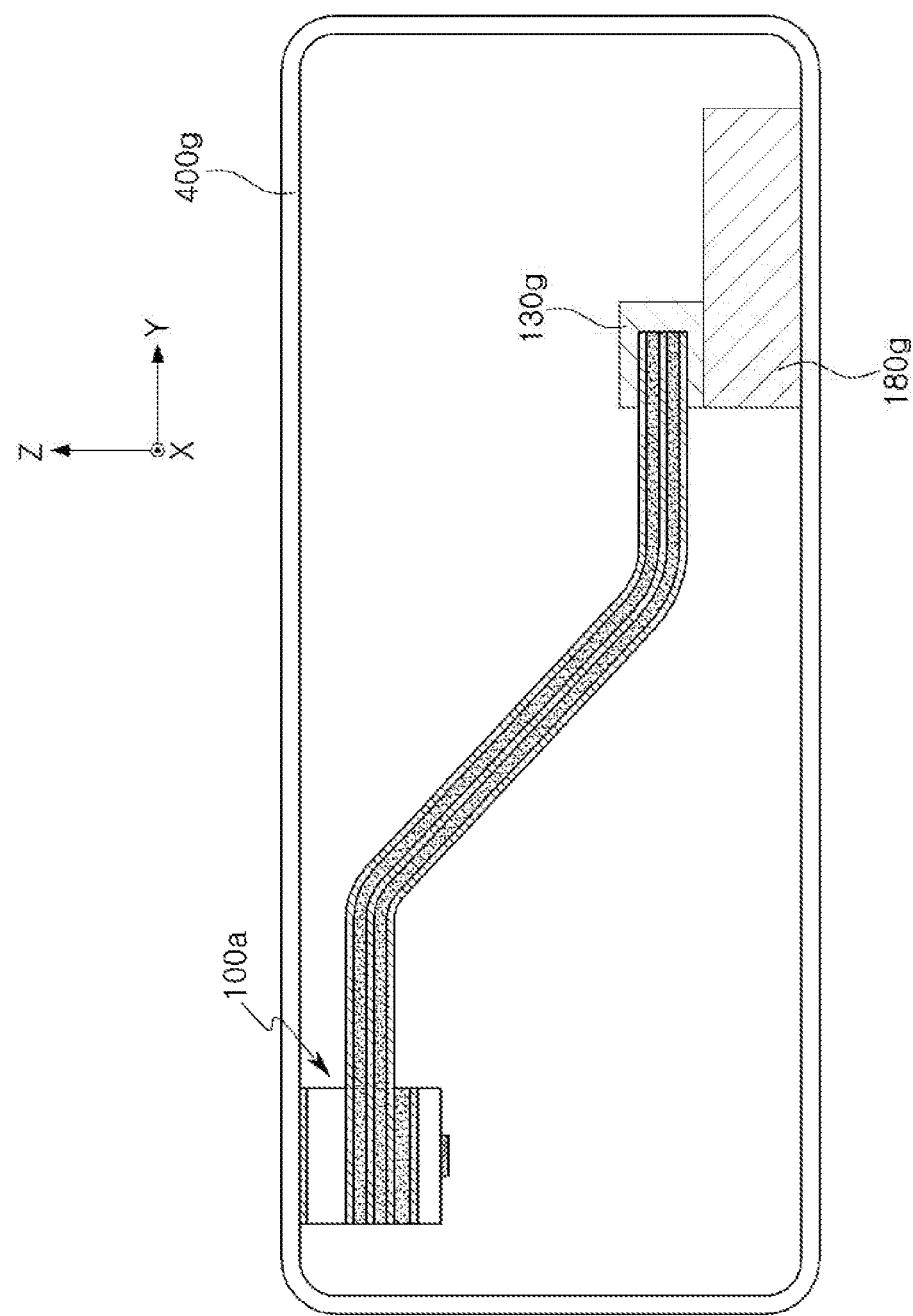
FIG. 8 is a side view illustrating an arrangement of a rigid-flexible substrate module in an electronic device according to one or more embodiments.

FIG. 8 is a side view illustrating an arrangement of a rigid-flexible substrate module in an electronic device according to one or more embodiments.

Referring to FIG. 8, a rigid-flexible substrate module 100a according to one or more embodiments may be disposed in an upper cover of an electronic device 400g and a set substrate 180g may be disposed in a lower cover of the electronic device 400g, and a signal connector 130g may be disposed on the set substrate 180g.

Therefore, the rigid-flexible substrate module 100a may be disposed in a position higher than a position of the signal connector 130g in the electronic device 400g. Since a laterally extended region of the rigid-flexible substrate module 100a may be bent, a connection path between the signal connector 130g and the rigid-flexible substrate module 100a may be easily secured, although there is a difference in height between the signal connector 130g and the rigid-flexible substrate module 100a.

Figure 9A:
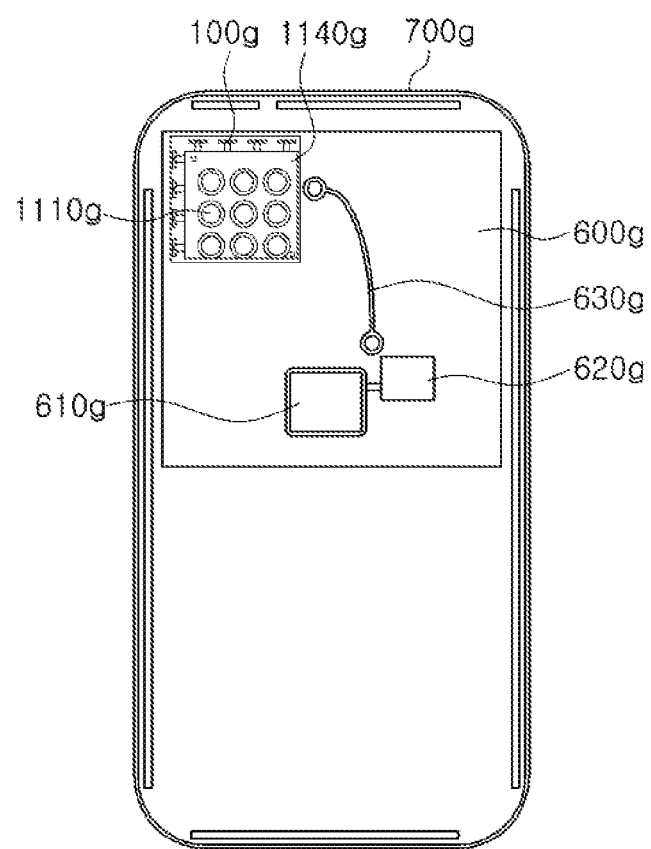
FIGS. 9A and 9B are plan views illustrating an arrangement of a rigid-flexible substrate module in an electronic device according to one or more embodiments.
Figure 9B:
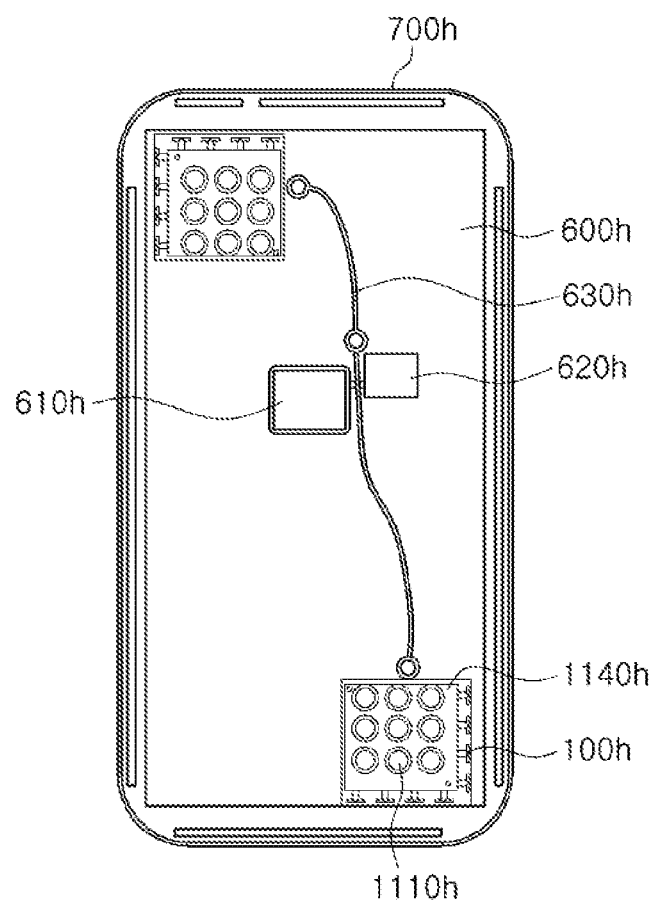

FIGS. 9A and 9B are plan views illustrating an arrangement of a rigid-flexible substrate module in an electronic device according to one or more embodiments.

Referring to FIG. 9A, a rigid-flexible substrate module 100g including a patch antenna pattern 1110g and an insulating layer 1140g may be disposed adjacent to a lateral boundary of an electronic device 700g on a set substrate 600g of the electronic device 700g.

The electronic device 700g may be a smartphone, a personal digital assistant, a digital video camera, a digital still camera, a network system, a computer, a monitor, a tablet, a laptop, a netbook, a television, a video game, a smartwatch, an automotive, or the like, but is not limited thereto.

A communications module 610g and a baseband circuit 620g may be further disposed on the set substrate 600g. The rigid-flexible substrate module may be electrically connected to the communications module 610g and/or the baseband circuit 620g through a coaxial cable 630g.

The communications module 610g may include at least a portion of a memory chip, such as a volatile memory (e.g., a DRAM), a non-volatile memory (e.g., a ROM), a flash memory, and the like; an application processor chip, such as a central processing unit (e.g., a CPU), a graphics processing unit (e.g., a GPU), a digital signal processor, a cryptographic processor, a microprocessor, a microcontroller, and the like; a logic chip, such as an analog-to-digital converter, an application-specific IC (ASIC), and the like, to perform a digital signal process.

The baseband circuit 620g may perform an analog-to-digital conversion, amplification in response to an analog signal, filtering, and frequency conversion to generate a base signal. The base signal input/output from the baseband circuit 620g may be transferred to the rigid-flexible substrate module via a cable.

For example, the base signal may be transferred to the IC through an electrical connection structure, a core via, and a wiring layer. The IC may convert the base signal into an RF signal in a millimeter wave (mmWave) band.

Referring to FIG. 9B, a plurality of rigid-flexible substrate modules each including a patch antenna pattern 1110g and an insulating layer 1140g may be disposed adjacent to a boundary of a side and a boundary of another side of an electronic device 700h on a set substrate 600h of the electronic device 700h. A communications module 610h and a baseband circuit 620h may be further disposed on the set substrate 600h. The plurality of rigid-flexible substrate modules may be electrically connected to the communications module 610h and/or the baseband circuit 620h through a coaxial cable 630h.

Meanwhile, the heat dissipation layer, the via, the conductive layer, the antenna layer, the patch antenna, the signal line, the feed via, the feed line, the heat sink, and the heat dissipation member in the one or more embodiments disclosed in the present specification may include a metallic material, for example, a conductive material, such as copper (Cu), aluminum (Al), silver (Ag), tin (Sn), gold (Au), nickel (Ni), lead (Pb), titanium (Ti), an alloy thereof, or the like, and may be formed according to plating methods such as a chemical vapor deposition (CVD), a physical vapor deposition (PVD), a sputtering process, a subtractive process, an additive process, a semi-additive process (SAP), a modified semi-additive process (MSAP), and the like, but is not limited thereto.

Meanwhile, the insulating layer may be filled in at least a portion of spaces between the heat dissipation layer, the via, the conductive layer, the antenna layer, the patch antenna, the signal line, the feed via, the feed line, the heat sink, and the heat dissipation member. For example, the insulating layer may be implemented with a thermosetting resin such as epoxy resin, as well as FR4, LCP, and LTCC, or a thermoplastic resin such as polyimide, or a resin impregnated into core materials such as glass fiber, glass cloth and glass fabric together with inorganic filler, prepregs, Ajinomoto build-up film (ABF), FR-4, bismaleimide triazine (BT), photoimageable dielectric (PID) resin, a copper clad laminate (CCL), a glass or ceramic based insulating material, or the like.

In the meantime, the RF signals disclosed in the present specification may have a format according to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated as the later ones, but are not limited thereto. A frequency of an RF signal, for example, 24 GHz, 28 GHz, 36 GHz, 39 GHz, and 60 GHz may be greater than a frequency of an IF signal, for example, e.g., 2 GHz, 5 GHz, and 10 GHz.

Meanwhile, the rigid-flexible substrate disclosed in the one or more embodiments of the present specification may be implemented as a rigid printed circuit board, and a rigid substrate and a flexible substrate may be separately manufactured and have a structure in which they are combined, for example, an electrical connection structure such as a solder ball, a bump, or the like may be connected thereto.

The flexible substrate module according to may have an efficient heat dissipation structure, may effectively shield electromagnetic noise, and may flexibly provide a space for arranging electronic devices.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A rigid-flexible substrate module comprising:
   a rigid-flexible substrate comprising a first region and a second region more flexible than the first region and comprising a first laterally extended region extending in a first lateral direction further than the first region;
   an integrated circuit (IC) disposed in a position lower than a position of the first region of the rigid-flexible substrate;
   a signal line electrically connected to the IC and extending to a lateral end of the second region of the rigid-flexible substrate;
   a first heat dissipation ground layer comprising a first portion that overlaps the first region when viewed in a vertical direction, and a second portion different from the first portion that overlaps the first laterally extended region when viewed in the vertical direction; and
   a second heat dissipation ground layer,
   wherein at least a portion of the second heat dissipation ground layer is disposed in the second region of the rigid-flexible substrate.

2. The rigid-flexible substrate module according to claim 1,
   wherein the signal line is disposed between the first heat dissipation ground layer and the second heat dissipation ground layer.

3. The rigid-flexible substrate module according to claim 2, further comprising a third heat dissipation ground layer, wherein at least a portion of the third heat dissipation ground layer is disposed between the first heat dissipation ground layer and the second heat dissipation ground layer in the second region of the rigid-flexible substrate, and spaced apart laterally from the signal line.

4. The rigid-flexible substrate module according to claim 1, further comprising a protection layer disposed in a position higher or lower than a position of the first laterally extended region of the second region of the rigid-flexible substrate,
   wherein at least a section of the second portion of the first heat dissipation ground layer is exposed through the protection layer when viewed in the vertical direction.

5. The rigid-flexible substrate module according to claim 1, wherein the rigid-flexible substrate further comprises a patch antenna disposed in the first region,
   wherein the IC is electrically connected to the patch antenna, and
   wherein the IC is configured to receive a base signal through the signal line and transmit a radio frequency (RF) signal having a frequency greater than a frequency of the base signal to the patch antenna.

6. An electronic device comprising the rigid-flexible substrate module of claim 1 disposed in a cover,
   wherein the first laterally extended region is connected to a signal connector disposed on a set substrate in the cover to electrically connect the IC to the set substrate.

7. A rigid-flexible substrate module comprising:
   a rigid-flexible substrate comprising a first region and a second region more flexible than the first region and comprising a first laterally extended region extending in a first lateral direction further than the first region;
   an integrated circuit (IC) disposed in a position lower than a position of the first region of the rigid-flexible substrate;
   a signal line electrically connected to the IC and extending to a lateral end of the second region of the rigid-flexible substrate;
   a first heat dissipation ground layer comprising a first portion that overlaps the first region when viewed in a vertical direction, and a second portion different from the first portion that overlaps the first laterally extended region when viewed in the vertical direction; and
   a protection layer disposed in a position higher or lower than a position of the first laterally extended region of the second region of the rigid-flexible substrate,
   wherein at least a section of the second portion of the first heat dissipation ground layer is exposed through the protection layer when viewed in the vertical direction.

8. A rigid-flexible substrate module comprising:
   a rigid-flexible substrate comprising a first region and a second region more flexible than the first region and comprising a first laterally extended region extending in a first lateral direction further than the first region;
   an integrated circuit (IC) disposed in a position lower than a position of the first region of the rigid-flexible substrate;
   a signal line electrically connected to the IC and extending to a lateral end of the second region of the rigid-flexible substrate;
   a first heat dissipation ground layer comprising a first portion that overlaps the first region when viewed in a vertical direction, and a second portion different from the first portion that overlaps the first laterally extended region when viewed in the vertical direction; and
   a patch antenna disposed in the first region of the rigid-flexible substrate and electrically connected to the IC, wherein the IC is configured to receive a base signal through the signal line and transmit a radio frequency (RF) signal to the patch antenna.

\* \* \* \* \*